United States Patent
Molyneux et al.

(10) Patent No.: US 9,013,254 B2
(45) Date of Patent: Apr. 21, 2015

(54) HERMETICALLY SEALED MANUAL DISCONNECT

(71) Applicant: Gigavac, LLC, Santa Barbara, CA (US)

(72) Inventors: Mike Molyneux, Santa Barbara, CA (US); Brent J Swartzentruber, Ventura, CA (US)

(73) Assignee: Gigavac, LLC, Carpinteria, CA (US)

( * ) Notice: Subject to any disclaimer, the term of this patent is extended or adjusted under 35 U.S.C. 154(b) by 0 days.

(21) Appl. No.: 13/654,882

(22) Filed: Oct. 18, 2012

(65) Prior Publication Data

US 2013/0102175 A1    Apr. 25, 2013

Related U.S. Application Data

(60) Provisional application No. 61/548,599, filed on Oct. 18, 2011, provisional application No. 61/706,041, filed on Sep. 26, 2012.

(51) Int. Cl.
  *H01H 9/00* (2006.01)
  *H05K 5/06* (2006.01)
  *H01H 13/06* (2006.01)

(52) U.S. Cl.
  CPC .............. *H05K 5/06* (2013.01); *H01H 13/063* (2013.01)

(58) Field of Classification Search
  CPC ..... H01H 13/063; H01H 1/66; H01H 50/023; H01H 51/29; H05K 5/06
  USPC .......... 335/126–132, 185, 196, 202, 205, 251
  See application file for complete search history.

(56) References Cited

U.S. PATENT DOCUMENTS

| | | | |
|---|---|---|---|
| 3,413,578 A | 11/1968 | Dennison | |
| 5,680,084 A | 10/1997 | Kishi et al. | |
| 6,121,561 A | 9/2000 | Sweeney | |
| 6,261,123 B1 | 7/2001 | Kruger et al. | |
| 7,868,720 B2 * | 1/2011 | Bush et al. | 335/151 |
| 7,944,333 B2 | 5/2011 | Swartzentruber et al. | |
| 8,395,463 B2 * | 3/2013 | Ito et al. | 335/78 |
| 2002/0097119 A1 | 7/2002 | Molyneux et al. | |
| 2007/0241847 A1 * | 10/2007 | Yamamoto et al. | 335/196 |

FOREIGN PATENT DOCUMENTS

GB    1203413    8/1970

OTHER PUBLICATIONS

International Search Report and Written Opinion from PCT Appl. No. PCT/US2012/060831, dated Feb. 5, 2013.

* cited by examiner

*Primary Examiner* — Bernard Rojas
(74) *Attorney, Agent, or Firm* — Koppel, Patrick, Heybl & Philpott (57) ABSTRACT

A hermetically sealed, high voltage manual disconnect that can be manually operated from outside the disconnect to transition between connect and disconnect states. The disconnect comprises a hermetically sealed housing having internal components for changing the state of the disconnect. A gas can fill the housing to allow for reliable high voltage operation. Different embodiments of the manual disconnect can include electrical and electronic components so that the state of the disconnect can be changed in response to an electrical signal.

18 Claims, 6 Drawing Sheets

HERMETICALLY SEALED MANUAL DISCONNECT

This application claims the benefit of provisional application No. 61/548,599 to Molyneux, which was filed on Oct. 18, 2011. This application further claims the benefit of provisional application No. 61/706,041 to Molyneux, which was filed on Sep. 26, 2012. Both provisional application 61/548,599 and provisional application 61/706,041, including their drawings, schematics, diagrams and written description, are hereby incorporated in their entirety by reference.

BACKGROUND OF THE INVENTION

1. Field of the Invention

The present invention relates to manual disconnects, and particularly to hermetically sealed manual disconnects.

2. Description of the Related Art

Manually connecting and disconnecting electrical circuits is as old as electrical circuits themselves, and is the way circuits are connected or disconnected if relays or contactors or other electrically operated switches are not used. In high power applications, or where a user needs to be assured that an electrical source is isolated, manually operated disconnects can be used. As voltages and currents have increased in modern day applications like electric vehicles or solar generation, the manual disconnects, if used, need to be very large to be able to practically disconnect higher power loads.

Because of their small size and weight, hermetically sealed disconnects can be used in high power applications, with these conventional sealed disconnects being electrically operated. Users may still want to manually disconnect a disconnect in these high power applications to be assured of the isolation. However, these conventional electrically operated hermetically sealed products do not provide for a manual disconnect option, as it is difficult to provide manual positive operation without compromising the hermetic seal of the disconnect.

SUMMARY OF THE INVENTION

The present invention provides hermetically sealed, high voltage manual disconnects that can be manually operated from outside the disconnect to change from the connect to the disconnect state. The disconnect comprises a hermetically sealed housing having internal components for changing the state of a relay. A gas can fill the housing to allow for reliable high voltage operation, with the housing made of a material that is substantially impermeable to the gas. Different embodiments of disconnects according to the present invention can also comprise electrical and electronic components so that the state of the disconnect can be changed both manually and in response to an electrical signal.

These and other further features and advantages of the invention would be apparent to those skilled in the art from the following detailed description, taking together with the accompanying drawings, in which:

DETAILED DESCRIPTION OF THE INVENTION

The present invention provides a low cost, high-power, manual disconnect in a hermetically sealed housing. The disconnect can comprise a mechanism for manual operation that allows for a user, such as an occupant of a vehicle, to manually change the state of the disconnect between connect and disconnect states, and thus affect the operation of an electric circuit coupled to the disconnect. This manual change of state can be accomplished without compromising the hermetic seal of the disconnect. This manual mechanism can also be included in disconnects having electrical connectors to change the state of the disconnect by an electrical signal to allow for disconnects that can change from connect to disconnect either manually or in response to an electrical signal.

The mechanisms that result in the state changes can be operable by different motions, including but not limited to linear or rotational movement. Many different mechanisms can be used, including but not limited to rotational or linear magnetic feed-throughs, or rotational or linear mechanical feed-throughs. It is understood that these are only a few examples of the many manual mechanisms that can be used in embodiments according to the present invention.

In some embodiments, the housing includes a flat, low cost ceramic header that provides an airtight seal. This allows the header to be manufactured using low cost materials and processes, while still providing a housing that can be gas filled under pressure to provide reliable high voltage operation through a long life cycle. The flat ceramic header also provides for inexpensive tooling, simple metallization and uncomplicated manufacturing processes while providing electrical isolation between the contacts.

In some embodiments, the header is not made of ceramic but instead comprises an epoxy material. There are several kinds of epoxy materials which bond satisfactorily with the materials that can be used for the housing (including plastic and metal) and which can provide an airtight seal due to their impermeability. This prevents leakage of air into internal vacuum conditions and loss of insulating gas under internal pressurized conditions. Examples of such epoxy header materials can be found in U.S. patent application Ser. No. 09/773,997, filed on Jan. 31, 2001, which published as US Patent Publication US 2002/0097119 A1 on Jul. 25, 2002, which is hereby incorporated in its entirety by reference, including the drawings, corresponding descriptions and disclosure regarding the use of epoxy compounds for providing hermetic seals. It is understood that the header can be comprised of many different materials suitable for providing an air tight seal and that the present disclosure and descriptions of various embodiments are not limited to specifically described arrangements and materials.

The invention below is described in relation to different embodiments of manual disconnects according to the present invention, but it is understood that the invention can be used with other disconnects or devices, and that the disconnects below can have different components arranged in different ways.

It will be understood that when an element or component is referred to as being "on", "connected to", "coupled to" or "in contact with" another element or component, it can be directly on, connected or coupled to, or in contact with the other element or component or intervening elements or components may be present. In contrast, when an element is referred to as being "directly on," "directly connected to", "directly coupled to" or "directly in contact with" another element or component, there are no intervening elements or components present.

Figure 1:
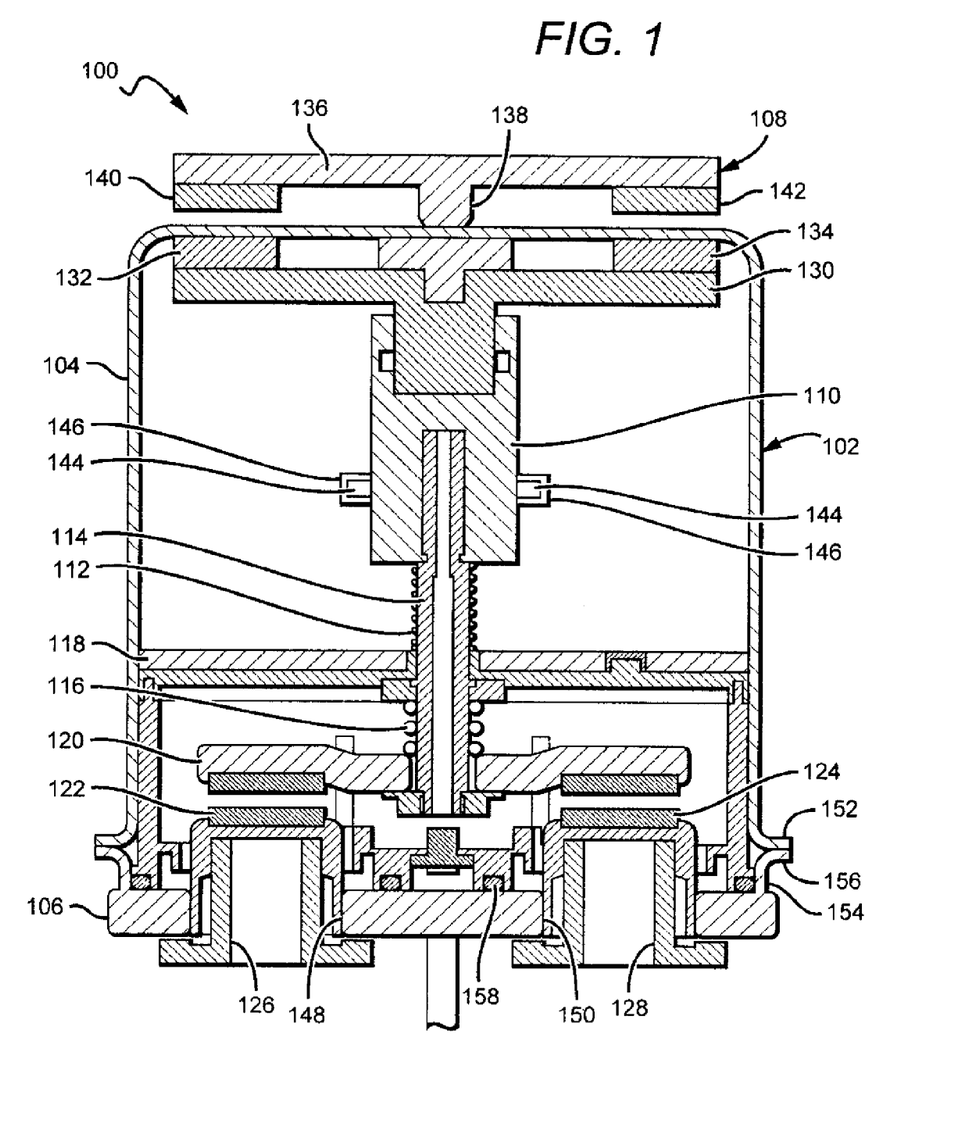
FIG. 1 is a sectional view of one embodiment of a manually operated sealed disconnect according to the present invention.

FIG. 1 shows one embodiment of a manually operated low cost, high-power disconnect 100 according to the present invention comprising a housing 102 having an outer cup 104 and a flat header 106. The disconnect's internal moving components can be arranged on the header 106 as further described below, and the header 106 is sized and arranged to mate with and mount in the opening of the cup 104 such that there is a hermetic seal between the two. The disconnect's internal moving components are held in the sealed internal chamber defined by the header 106 and the cup 104. The chamber can be filled with gas by an air tube (not shown) that passes through the header 106. Alternatively, the air tube can be used to form a vacuum within the chamber. The disconnect's internal components are also contacted through the header 106. The disconnect 100 also comprises a manual mechanism 108, which can be mechanical, for manually changing the state of the disconnect, with some embodiments relying on a rotational/axial feed through as described in more detail below. The mechanism 108 operates while still maintaining a sealed disconnect housing 102, thereby allowing the disconnect 100 to maintain its vacuum or gas.

The internal components of the disconnect 100 further comprise a plunger 110, a plunger spring 112, a plunger shaft 114 (which can be hollow), contact springs 116, substantially circular plate 118, and at least one moveable contact 120. Moveable contact 120 can comprise a single contact or multiple contacts arranged to operate in conjunction with one another such that when moveable contact 120 moves, the multiple contacts will move together.

The shaft 114 goes through the middle of the plunger 110 with the plunger spring 112 held between the lower portion of the plunger 110 and circular plate 118. When the manual mechanism is operated as described below, the plunger 110 moves moveable contact 120 towards fixed contacts 122, 124 and the plunger spring 112 is compressed between the lower portion of the plunger 110 and the circular plate 118. When the manual mechanism operates in the opposite direction, and the plunger 110 moves away from the fixed contacts 122, 124, the plunger spring expands. In embodiments incorporating a hollow shaft, plunger shaft 114 enables the plunger 110 to move readily in a sealed environment, as the hollow shaft 114 allows any gas within the sealed housing 102 to flow freely through the plunger 110 and the pressure to equalize during the travel of plunger 110.

When activating the manual mechanism to place the disconnect in the connect state, the plunger moves moveable contact 120 a certain distance known as the "contact gap" before it makes contact with fixed contacts 122, 124. The contact gap is the distance between moveable contact 120 and fixed contacts 122, 124 which provides electrical isolation to prevent current flow when movable contact 120 is not in contact with the fixed contacts 122, 124. When the movable contact 120 is in contact with fixed contacts 122, 124, a conductive path is formed between first and second external terminal studs 126, 128, which are typically connected to the fixed contacts 122, 124. The terminal studs 126, 128 can be located externally to the housing 102 in different embodiments, but it is understood that the terminal studs 126, 128 may be arranged in a number of different ways.

In some embodiments, after moveable contact 120 makes contact with fixed contacts 122, 124, the plunger 110 continues to move and compresses first contact spring 116. This additional post-contact movement of the plunger is known in the art as plunger overtravel. The compression force of first contact spring 116 is applied to the contacts through the initial part of the plunger overtravel. In one embodiment, plunger spring 112 has a lower spring rate than contact spring 116.

In different embodiments, the manual mechanism is arranged such that components inside the housing are used in cooperation with components external to the housing. In some of these embodiments, a magnetic force or attraction between the internal and external components feeds through the housing (without compromising the housing) allowing movement of the external components to cause movement of the internal components.

In disconnect 100, manual mechanism 108 relies on a rotational/axial feed through mechanism which allows for the state of the disconnect to be changed without having a mechanical connection between the manual mechanism components and the disconnect's internal components. In one embodiment according to the present invention, a magnetic field is used to impart movement to the disconnect's internal components when the manual mechanism is rotated. This arrangement allows for changing the state of the disconnect without having a mechanism that passes through housing 102 of the disconnect. This allows for the present invention to maintain a sealed housing, which can allow the housing to hold a larger vacuum, or for the housing to hold a gas under higher pressure. This arrangement can also result in smaller devices with higher ratings.

In one embodiment, the manual mechanism can comprise a plunger bar 130 mounted to the plunger 110, with both components being internal to the disconnect's housing 102. The plunger bar 130 is located near the top of the housing 102, with first and second magnets 132, 134 mounted at opposing ends of the bar 130. The magnets 132, 134 can be mounted in many different locations, with the embodiment shown having the magnets 132, 134 facing the top inner surface of the housing 102. The bar can be made of many different rigid materials such as a metal, plastic or ceramic, and can comprise a single bar, as shown in FIG. 1, or multiple bars. The bar 130 can be mounted to the plunger 110 with a rigid connection so that rotation of the bar causes rotation of the plunger 110 within the housing 102.

Rotation of the plunger bar 130 is caused by the force of one or more external magnetic fields drawing the magnets 132, 134 in a rotational motion. Many different arrangements can be used to provide this external magnetic field, and in the embodiment shown, an external magnetic bar 136 is arranged on top of the housing 102 in an opposing fashion to the plunger bar 130. The external bar 136 is mounted to the housing 102 such that it can be rotated about the top of the housing 102, preferably by means of a pivot 138. The plunger bar 130 can comprise magnets to provide the external magnetic field to cause rotation of the plunger bar 130, and in the embodiment shown the first and second external magnets 140, 142 are mounted to the underside of the plunger bar 130, facing the plunger bar magnets 132, 134 through the housing 102. The magnetic field from the plunger bar's first and second external magnets 140, 142 interacts with the magnetic field of the plunger bar magnets 132, 134, such that there is a magnetic attraction between the magnets. As the external bar 136 is rotated, the magnetic field between the plunger bar magnets 132, 134 and the external magnets draws the plunger bar 130 to rotate with external bar 136.

In other embodiments, first and second external magnets 140, 142 can be configured such that an opposing magnetic field between plunger bar magnets 132, 134 and first and second external magnets 140, 142 is provided. In this embodiment, the magnetic field between the plunger bar magnets 132, 134 and the external magnets causes the plunger bar 130 to rotate in opposition to external bar 136. In another embodiment, plunger bar magnets 132, 134 and first and second external magnets 140, 142 can be arranged such that there is an opposing magnetic field between them such that the external magnetic bar can be pushed closer to housing 102, thus changing the position of plunger bar magnets 132, 134, and therefore plunger bar 130. It is understood that the external magnets can be arranged in many different ways beyond being mounted to an external bar, and like the plunger bar 130, the external bar can comprise multiple pieces mounted to the housing in many different ways.

In some embodiments, rotation of the plunger bar 130 can cause rotation of the plunger 110. The plunger 110 can be arranged with many different mechanisms that translate rotational movement of the plunger bar 130 to linear motion of the plunger 110. In the embodiment shown, the plunger 110 can comprise one or more tabs 144 on a surface of the plunger 110 and arranged to cooperate with one or more slots 146. The slot 146 can be shaped or angled so that as the plunger 110 is rotated, the cooperation of the tabs 144 in the slots 146 causes the plunger 110 to move linearly within the housing 102; i.e. between the top and bottom of disconnect 100 depending on the direction of rotation. This causes the disconnect to be moved between connect and disconnect states.

In some embodiments, the plunger and shaft can be arranged so that rotation of the plunger 110 does not cause rotation of the shaft 114, but linear movement of the plunger 110 causes linear movement of the shaft 114. In other embodiments, plunger 110 and shaft 114 can rotate in unison while not causing rotation of the movable contact 120. It is understood that these are only some of the many arrangements that can be utilized in disconnects according to the present invention.

Header 106 can take many different shapes, but in the embodiment shown comprises a flat shape to help make tooling inexpensive, the metallization simple, and the post processes less complicated. Header 106 is preferably made of ceramic or epoxy material, although other materials resistant to high temperatures may also be used. Header 106 comprises first and second contact holes 148, 150 sized so that external studs 126, 128 can pass through the header 106 to make electrical contact with fixed contacts 122, 124. The contact holes 148, 150 and the outer rim of the header 106 are preferably coated with an electrically conductive material, with a preferred conductive material comprising a metal such as copper.

Different embodiments can also comprise sealed tubes arranged to allow gasses to be injected into the housing, preferably under pressure, or a vacuum to be created in the housing. After the gasses are injected (or vacuum conditions created), the tube is sealed so that no further gasses can pass in or out. The cup 104 and header 106 are preferably made of a material having low or substantially no permeability to the gas injected into the housing, with the cup 104 being made from a metal such as iron and flat header 106 preferably made from ceramic or epoxy material. Many different gasses can be injected into the housing 102, with the preferred gas being hydrogen because it protects the copper from oxidation, keeps the contacts clean, and keeps contact resistance low.

To provide a hermetically sealed housing 102, the inner cup 104 can be arranged with a flange 152 around the edge of its opening. A header braze assembly 154 is arranged with a complimentary flange 156, and is sized so that both flange 152 and 156 can rest on one another. O-rings 158 are included around each of the contact holes 148, 150 to ensure that a seal is formed at each of the holes at the header 106. The O-rings 158 are preferably suited to high temperature applications, and are used to seal arc chamber 160. The seal prevents internal components in the arc chamber 160 can reach other metal parts outside the arc chamber 160.

Some disconnect embodiments can also comprise a solenoid for electrical operation that allows for the disconnect to change states both manually and electrically. The solenoid can be energized by applying an appropriate bias through auxiliary contact lead wires (not shown). This can cause the movable contact 120 to contact the fixed contacts 122, 124 to form a conductive path between first and second external terminal studs as described above for manual operation. Many different solenoids can be used, with a suitable solenoid operating under a low voltage and with a relatively high force. One example of a suitable solenoid is commercially available solenoid Model No. SD1564 N1200, from Bicron Inc., although many other solenoids can be used.

Figure 2:
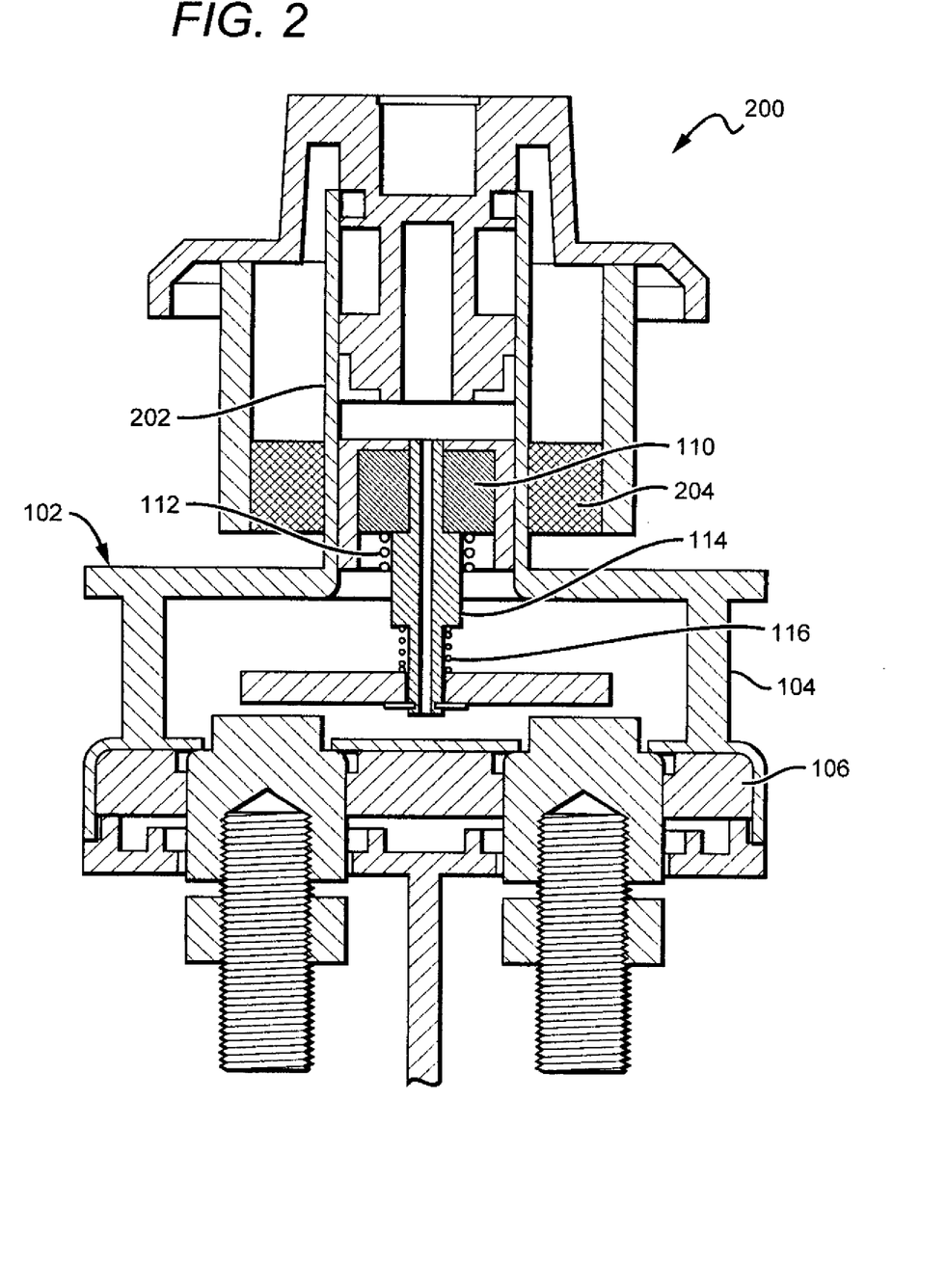
FIG. 2 is a sectional view of another embodiment of a manually operated sealed disconnect according to the present invention.

As mentioned above, many different manual mechanisms can be used in disconnects according to the present invention. FIG. 2 shows another embodiment of a disconnect 200 that is similar to disconnect 100; for similar features, the same reference numbers from FIG. 1 are used in FIG. 2. The disconnect 200 comprises a housing 102, inner cup 104, and header 106, arranged as described above to hold the disconnect's internal components. The shaft 114 is arranged so that is passes though the housing 102, with the portion of the tube extending from the housing being arranged in a shaft tube 202. In some embodiments the tube 202 is sealed and is mounted to the housing with a seal. This allows the disconnect 200 to hold a gas or vacuum without leaking to the ambient through the tube.

The shaft 114 can have a plunger spring 112, and a contact spring 116 included in the housing 102. Shaft 114 or plunger 110 can be made of a material that is attracted to magnets, or can comprise a magnet (not shown) mounted on or near the shaft 114 such that movement of the magnet causes movement of the shaft 114. The disconnect 200 comprises one or more external magnets 204 that are around the tube 202, with the magnetic field from the external magnets causing a magnetic attraction between the external magnets and the shaft 114. As magnets 204 are moved up and down the tube 202, the shaft also moves up and down, causing the disconnect to change between connect and disconnect states. As discussed above, it is also understood that there are embodiments wherein movements of external magnets causing a magnetic repulsion via an opposing magnetic field can cause movement of the shaft 114.

Many different mechanisms can be used to cause movement of the external magnets up and down the tube, such as a handle that provides a pull and push movement to move the magnets. Alternatively, a rotation mechanism can be used that is arranged to translate rotational movement to linear movement.

Figure 3:
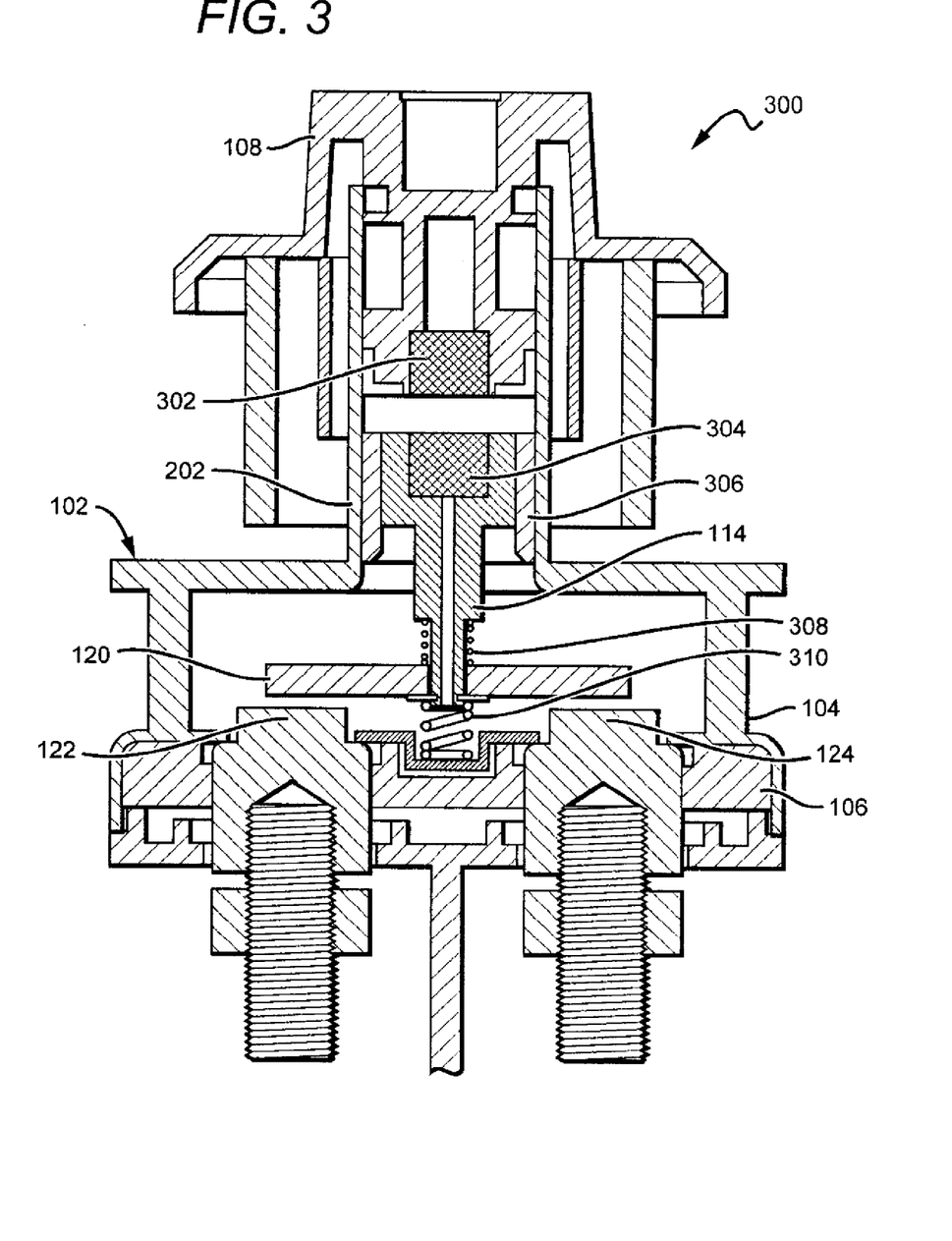
FIG. 3 is a sectional view of another embodiment of a manually operated sealed disconnect according to the present invention.

FIG. 3 shows a disconnect 300 that utilizes opposing magnets to control the movement of shaft 114. The disconnect 300 comprises a housing 102, inner cup 104, and header 106, arranged as described above to hold the disconnect's internal components. The shaft 114 is arranged so that is passes though the housing 102, with the portion of the shaft extending from the housing being arranged in a shaft tube 202. Disconnect 300 further comprises an external magnet 302 and an internal magnet 304 which are arranged such that there is an opposing magnetic field between them. Manual mechanism 108 can contain or be attached to external magnet 302 and be arranged to move linearly, sliding along bearings 306. Bearings 306 can be made of many different materials, including but not limited to Teflon, iron and plastic. Internal magnet 304 can be attached to or arranged with shaft 114 or can be attached to or function as a plunger as described above, such that movement of internal magnet 304 causes movement of shaft 114.

During operation of disconnect 300, manual mechanism 108 is pushed downward, causing it to move along bearings 306 such that external magnet 302 nears the position of internal magnet 304. The opposing magnetic field pushes internal magnet 304 downward which causes shaft 114 to move downward, causing moveable contact 120 to contact fixed contacts 122, 124, causing disconnect 300 to enter a connect state. Adjusting manual mechanism 108 upward reduces the opposing magnetic field, allowing shaft 114 to return to its original position. The return of shaft 114 to its original position can be assisted by first and second contact springs 308, 310.

First and second contact springs 308, 310 can be arranged in various ways. In one embodiment, first and second contact springs 308, 310 are arranged in the same location, with first contact spring 308 nested inside second contact spring 310. This embodiment can increase the force of the contacts at the end of plunger overtravel, which can improve the electrical performance of the disconnect. In this embodiment, the compression force of the first contact spring is applied to the contacts through the initial part of the plunger overtravel. As external and internal magnets 302, 304 approach the end of plunger overtravel, there is a significant rise in magnetic force. In order to take advantage of this force, second contact spring 310 is activated. First contact spring 308 can be preloaded and have a lower spring rate, while second contact spring 310 can be not preloaded, such that is remains inactive until the plunger travels a certain overtravel distance.

Figure 4:
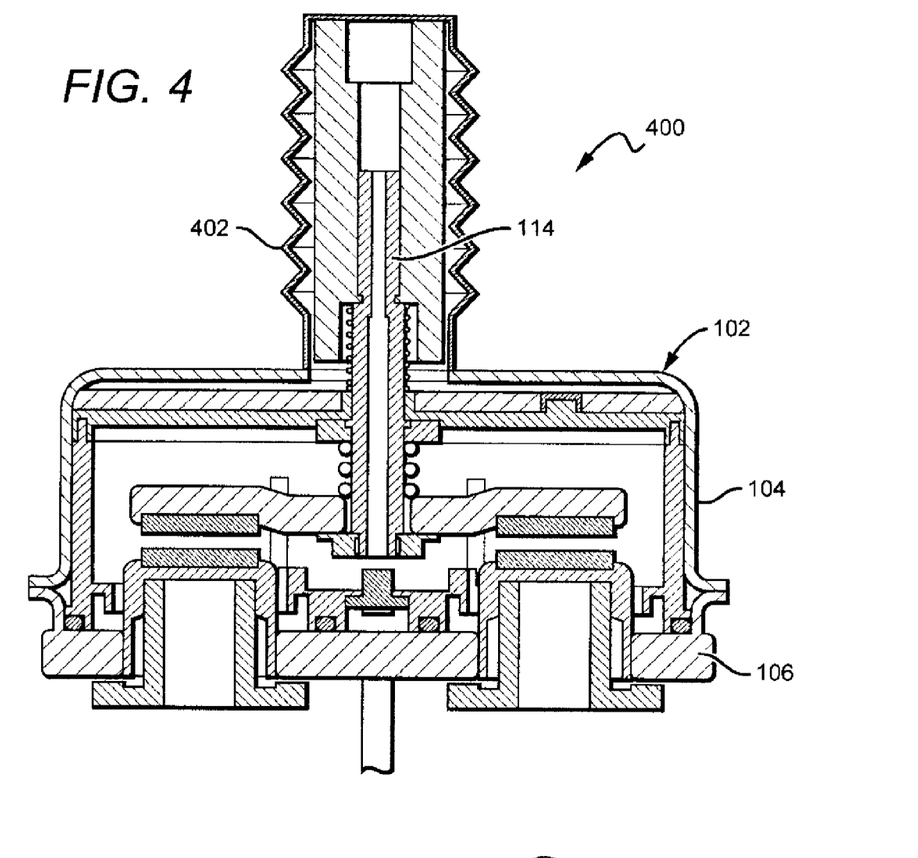
FIG. 4 is a sectional view of another embodiment of a manually operated sealed disconnect according to the present invention.

It is understood that various mechanisms can be provided that rely on mechanical movement to change the state of a disconnect according to the present invention. FIG. 4 shows still another embodiment of a disconnect 400 that relies on linear mechanical movement to change the disconnect's state. The disconnect 400 comprises a housing 102, inner cup 104 and header 106, that are arranged to hold the disconnect's inner components as described above. A shaft 114 is arranged so that is passes through the housing 102; the portion of the shaft extending from the housing is arranged in a bellowed tube 402. In some embodiments, the bellowed tube 402 is sealed and mounted to the housing with a seal, and is arranged so that a linear down force on the tube can cause a corresponding collapse of the tube 402. This collapse in turn causes the shaft to move down to the connect state. A return up force on the tube 402 causes the return of the tube 402, and the resulting movement of the shaft causes the disconnect to return to the disconnect state. As above, many different mechanisms can be used to cause this linear force, such as a button, handle, or mechanism that translates rotational to linear movement.

Figure 5:
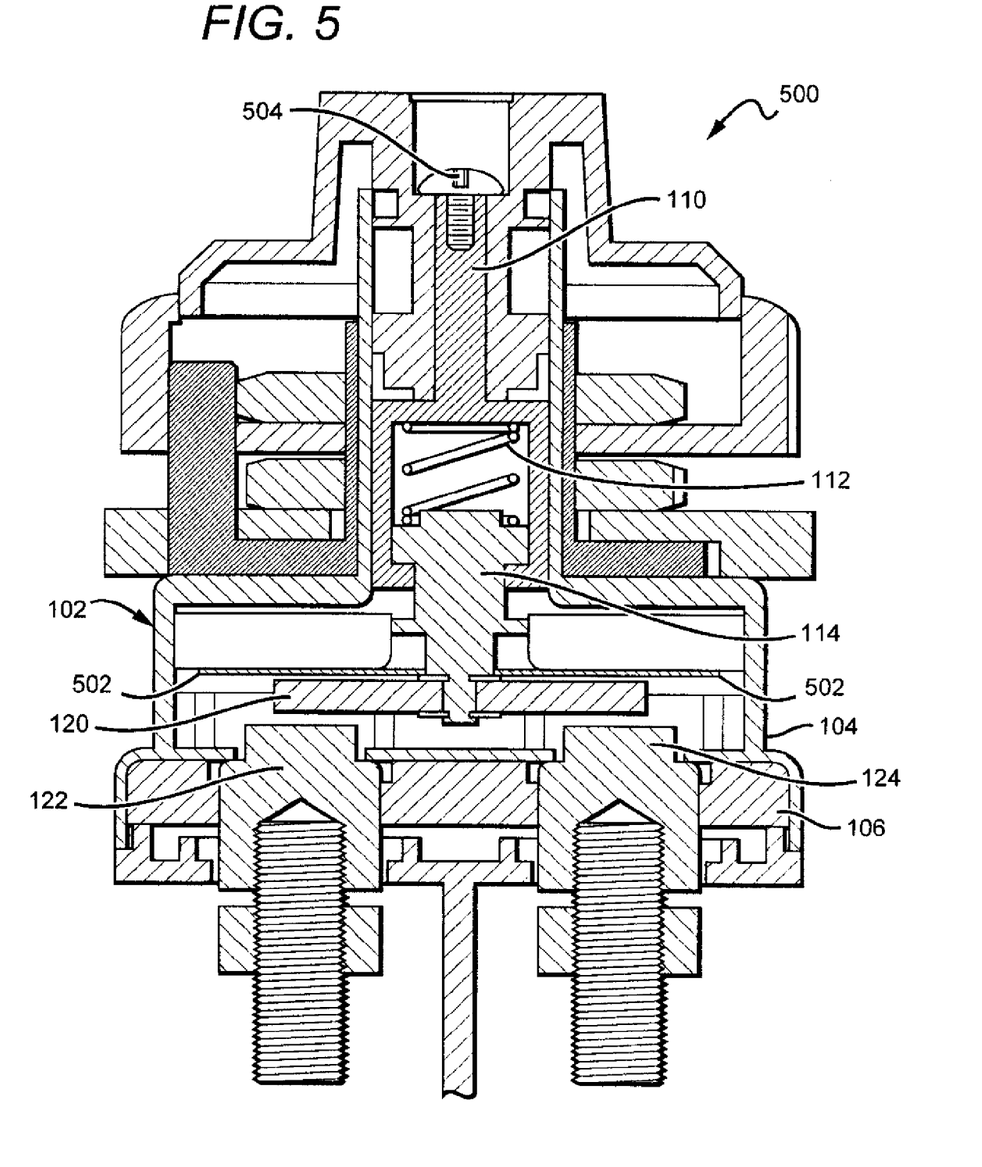
FIG. 5 is a sectional view of another embodiment of a manually operated sealed disconnect according to the present invention.

FIG. 5 shows another embodiment of a manual disconnect 500 that relies on force applied to a diaphragm structure 502 to change the disconnect's state. The disconnect 500 comprises a housing 102, inner cup 104 and a header 106, that are arranged to hold the disconnect's inner components as described above. A shaft 114 is arranged so that it passes through the housing 102, and can apply force to diaphragm 502. Diaphragm 502 is a structure that can expand, flex, contract or change shape or configuration when force is applied to it. The expansion/flexion/contraction and shape/configuration change nature of diaphragm 502 can be due to many factors, including but not limited to its shape, physical design, material properties and/or arrangement. The expansion/flexion/contraction or change in shape/configuration of diaphragm 502 can cause diaphragm 502 to interact with the movable contact 120, thereby causing it to contact the fixed contacts 122, 124.

Diaphragm 502 can provide leverage, allowing a smaller applied force to translate into a larger force to affect the movement of moveable contact 120. Shaft 114 can be near, part of or physically connected to diaphragm 502. In one embodiment, force applied to the center of diaphragm 502 causes the diaphragm to flex, causing moveable contact 120 to contact fixed contacts 122, 124. Discontinuing the applied force causes diaphragm 502 to return to its original configuration, allowing movable contact 120 to return to the disconnect position. Diaphragm 502 can be many shapes and made of many different materials. In one embodiment, diaphragm 502 is cylindrical and made of metal such that when a sufficient force is applied to the center of diaphragm 502, the diaphragm flexes at the point of application of the force and flexes downward. In one embodiment, a sufficient amount of force is 40 pounds of pressure. The diameter of diaphragm 502 can be adjusted based on the distance moveable contact 120 needs to travel (i.e. the contact gap), with a larger diameter beings selected for a greater travel distance.

In one embodiment, diaphragm 502 further comprises a button (not shown) which is a structural feature or area that allows for further control over the effect an applied force has on diaphragm 502. In one embodiment, the button is a protrusion from the center of diaphragm 502 which would concentrate an applied force to the center of diaphragm 502.

Figure 6:
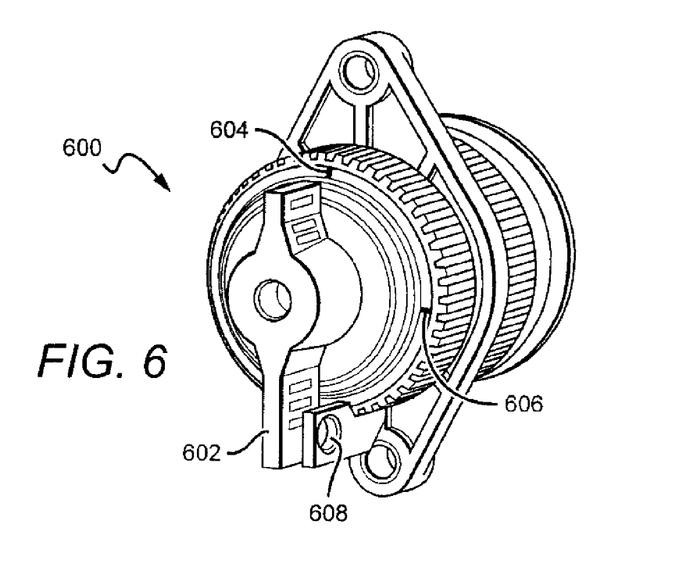
FIG. 6 is a perspective view of a handle mechanism as might be used with a manually operated sealed disconnect according to the present invention.

The movement of plunger 110 or shaft 114 can be controlled by various manual means which can be attached to a handle mount 504. FIG. 6 shows a handle mechanism 600 which translates rotational movement of the handle 602, to cause linear motion of plunger 110. One such translation means, as discussed above in reference to FIG. 1, includes plunger 110 comprising one or more tabs 144 on a surface of the plunger 110 and being arranged to cooperate with one or more slots 146. The slot 194 can be shaped or angled so that as the plunger 110 is rotated, the cooperation of the tabs 144 in the slots 146 causes the plunger 110 to move linearly within the housing 102; i.e. between the top and bottom of the disconnect depending on the direction of rotation. This causes the disconnect to transition between connect and disconnect states.

Handle mechanism 600 can be arranged such that the rotational movement of handle 602 can have multiple positions, each corresponding to different states of connection. In one embodiment, handle mechanism 600 has a first position 604 and a second position 606, wherein one position indicates the manual disconnect is in a connect state and the other position indicates that the manual disconnect is in a disconnect state. Handle mechanism 600 can further comprise locking mechanism 608 which can lock the position of handle 602 in first position 604. Locking mechanism 608 can be any means of holding handle 602 in place. In one embodiment, locking mechanism 608 comprises a hole which is aligned to a corresponding hole in handle 602. A locking means such as a standard padlock can be inserted through both holes.

Figures 7, 8:
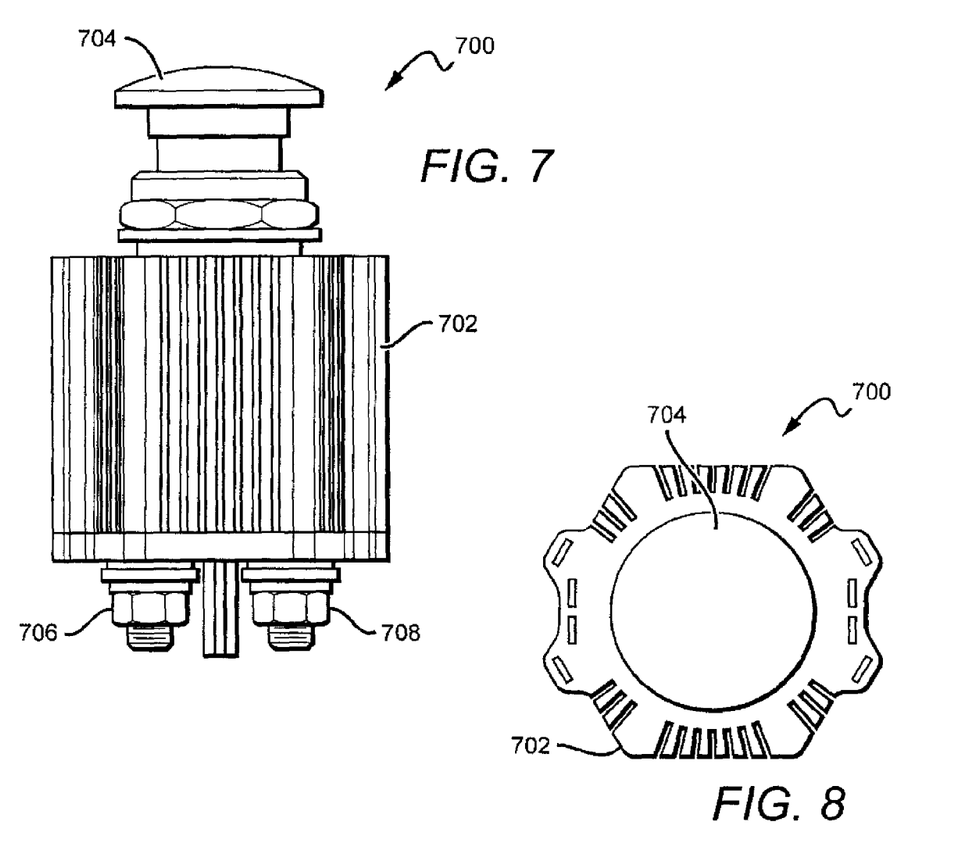
FIG. 7 is a side view of another embodiment of a manually operated sealed disconnect according to the present invention.
FIG. 8 is a top view of the disconnect shown in FIG. 7.
Figure 9:
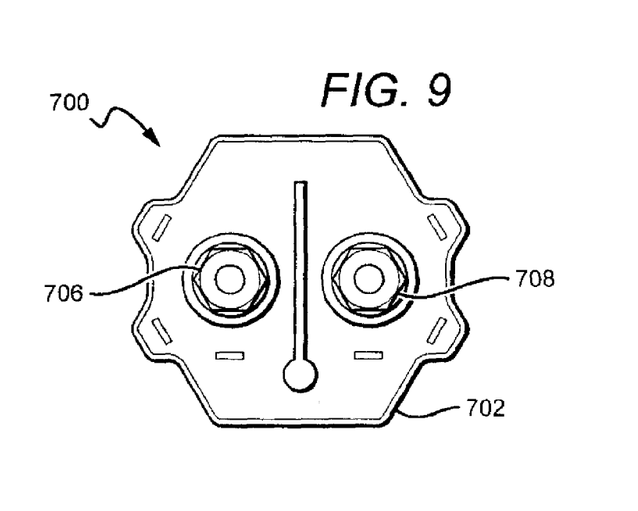
FIG. 9 is a bottom view of the disconnect shown in FIG. 7.

FIGS. 7-9 show side, top and bottom views, respectively of one embodiment of a disconnect 700 with a housing 702, with a manual mechanism 704 that allows for manually changing the state of the disconnect between connect or disconnect. The mechanism 704 can be used to provide up/down linear motion, or can be used to provide a rotational movement that is translated into linear movement as described above. The mechanism 704 can be used with a mechanical or magnetic feed-through as described above. The disconnect comprises external terminal studs 706, 708 for connecting the disconnect to external circuitry.

Although the present invention has been described in considerable detail with reference to certain preferred configurations thereof, other versions are possible. The disconnect arrangement can have many different variations. The spirit and scope of the invention should not be limited to the preferred versions of the invention described above.

We claim:

1. A manual disconnect, comprising:
a hermetically sealed housing comprising internal components for changing the state of said disconnect between connect and disconnect states, said housing comprising a cup for holding said internal components and a header covering said cup with an airtight seal, said internal components comprising a diaphragm structure in communication with at least one movable contact, said diaphragm structure arranged such that a force applied to said diaphragm structure causes it to flex and interact with said at least one moveable contact, causing said at least one moveable contact to change position;
terminals electrically connected to said internal components for connection to external circuitry; and
an external manual mechanism for controlling said internal components as needed to change the state of said disconnect between said connect and disconnect states.

2. The manual disconnect of claim 1, wherein said at least one moveable contact moves in response to activation of said external manual mechanism, and at least one fixed contact electrically connected to said terminals.

3. The manual disconnect of claim 2, wherein said disconnect is in the disconnect state when said at least one moveable contact is not in contact with said at least one fixed contact and said disconnect is in the connect state when said at least one moveable contact is in contact with said at least one fixed contact.

4. The manual disconnect of claim 2, said disconnect arranged such that rotational movement of said external manual mechanism causes linear movement of said at least one moveable contact.

5. The manual disconnect of claim 2, said disconnect arranged such that linear movement of said external manual mechanism causes linear movement of said at least one moveable contact.

6. The manual disconnect of claim 2, said disconnect arranged such that rotational movement of said external manual mechanism causes rotational movement of said at least one moveable contact.

7. The manual disconnect of claim 2, said disconnect arranged such that linear movement of said external manual mechanism causes rotational movement of said at least one moveable contact.

8. The manual disconnect of claim 1, wherein said hermetically sealed housing is filled with a gas.

9. The manual disconnect of claim 1, wherein said hermetically sealed housing is under vacuum conditions.

10. A manual disconnect, comprising:
a hermetically sealed housing comprising a cup and a header covering said cup with an airtight seal;
internal components in said hermetically sealed housing for changing the state of said disconnect between connect and disconnect states, said internal components comprising:
a shaft that moves in response to activation of an external manual mechanism;
at least one moveable contact in communication with said shaft which moves in conjunction with said shaft;
at least one fixed contact; and
a diaphragm structure in communication with said at least one movable contact, said diaphragm structure arranged such that a force applied to said diaphragm structure causes it to flex and interact with said at least one moveable contact, causing said at least one moveable contact to change position; and
terminals electrically connected to said fixed contacts for connection to external electrical circuitry.

11. The manual disconnect for claim 10, wherein said shaft is hollow.

12. The manual disconnect of claim 10, further comprising a plunger in communication with said shaft, wherein said shaft moves in response to force applied by said plunger.

13. The manual disconnect of claim 10, wherein said diaphragm structure further comprises a button for concentrating a force applied to said diaphragm structure to a specific area of said diaphragm structure.

14. The manual disconnect of claim 10, wherein said diaphragm structure is arranged to provide leverage such that a smaller force applied to said diaphragm structure is translated to a larger force applied to said at least one movable contact.

15. The manual disconnect of claim 10, said disconnect arranged such that rotational movement of said external manual mechanism causes linear movement of said shaft.

16. The manual disconnect of claim 10, wherein said hermetically sealed housing is filled with a gas.

17. The manual disconnect of claim 10, wherein said hermetically sealed housing is under vacuum conditions.

18. A method for manually connecting and disconnecting an electrical circuit, said method comprising the steps of:
1) providing a hermetically sealed manual disconnect comprising internal components comprising a diaphragm structure in communication with at least one movable contact, said diaphragm structure arranged such that a force applied to said diaphragm structure causes it to flex and interact with said at least one moveable contact, causing said at least one moveable contact to change the state of said disconnect between connect and disconnect states, terminals electrically connected to said internal components for connection to said electrical circuit, and an external manual mechanism for controlling said internal components as needed to change the state of said disconnect between said connect and disconnect states;
2) connecting said terminals to said electrical circuit; and
3) activating said external manual mechanism to change the state of said disconnect.

* * * * *